US008275011B2

United States Patent
Arai et al.

(10) Patent No.: US 8,275,011 B2
(45) Date of Patent: Sep. 25, 2012

(54) OPTICAL TRANSMISSION MODULE, WAVELENGTH MONITOR, AND WAVELENGTH DRIFT DETECTION METHOD

(75) Inventors: Takaharu Arai, Yokohama (JP); Kenji Yoshimoto, Yokohama (JP); Hayato Minekawa, Yokohama (JP)

(73) Assignee: Opnext Japan Inc., Kanagawa (JP)

( * ) Notice: Subject to any disclaimer, the term of this patent is extended or adjusted under 35 U.S.C. 154(b) by 757 days.

(21) Appl. No.: 12/363,115

(22) Filed: Jan. 30, 2009

(65) Prior Publication Data

US 2009/0251684 A1  Oct. 8, 2009

(30) Foreign Application Priority Data

Jan. 31, 2008  (JP) ................................. 2008-021174

(51) Int. Cl.
*H01S 3/04* (2006.01)
(52) U.S. Cl. ........................................................ 372/34
(58) Field of Classification Search ...................... 372/34
See application file for complete search history.

(56) References Cited

U.S. PATENT DOCUMENTS

2004/0146077 A1* 7/2004 Kathman et al. ............... 372/32

FOREIGN PATENT DOCUMENTS

| JP | 05-090698 A | 4/1993 |
| JP | 2003-324241 A | 11/2003 |
| JP | 2004-132704 A | 4/2004 |
| JP | 2005-085815 A | 3/2005 |

OTHER PUBLICATIONS

Japanese Office Action, with partial English translation, issued in Japanese Patent Application No. 2008-021174, dated Oct. 18, 2011.

* cited by examiner

*Primary Examiner* — Patrick Stafford
(74) *Attorney, Agent, or Firm* — McDermot Will & Emery LLP

(57) ABSTRACT

To detect a wavelength drift of laser light with no error, an optical transmission module (10) includes: a laser diode (20); a laser temperature calculation section (52) for detecting the temperature of the laser diode (20) that monotonously increases with respect to a wavelength of the laser light; a wavelength calculation section (44) for detecting a transmittance of the laser light incident on an etalon filter (36) whose transmittance periodically varies with respect to the wavelength of the incident light, and a laser wavelength corresponding to the transmittance; and a wavelength error obtaining section (54) for detecting a wavelength error (wavelength drift), from a target wavelength, of the laser light output from the laser diode (20), based on the temperature detected by the laser temperature calculation section (52) and the laser wavelength detected by the wavelength calculation section (44).

11 Claims, 3 Drawing Sheets

OPTICAL TRANSMISSION MODULE, WAVELENGTH MONITOR, AND WAVELENGTH DRIFT DETECTION METHOD

CROSS-REFERENCE TO RELATED APPLICATION

The present application claims priority from Japanese application JP 2008-021174 filed on Jan. 31, 2008, the content of which is hereby incorporated by reference into this application.

BACKGROUND OF THE INVENTION

1. Field of the Invention

The present invention relates to an optical transmission module, a wavelength monitor, and a wavelength drift detection method, and more particularly, to a technology for detecting a wavelength drift of laser light.

2. Description of the Related Art

In a wavelength multiplexing optical communication system, wavelength grids are generally set at intervals of as narrow as 50 to 100 GHz, and an optical line is assigned to each wavelength grid. In such a system, there are cases where a wavelength drift from a target wavelength grid of an optical signal, which occurs on a line, affects the communication conditions of not only that line but also other adjacent lines. For this reason, means for detecting whether or not the light wavelength of each line exceeds a predetermined range is necessary.

In this regard, there is known a technology of stabilizing the light wavelength by monitoring the laser temperature by a temperature detector such as a thermistor and keeping the laser temperature constant with the use of a Peltier device or the like. JP 2004-132704 A and JP 2003-324241 A each disclose a wavelength monitor that monitors the light wavelength with high accuracy by using an etalon filter. The etalon filter is an optical filter having such a characteristic that the transmittance periodically increases and decreases with respect to the wavelength (frequency) as illustrated in FIG. 4. As long as the light wavelength varies in the neighborhood of the target wavelength illustrated in FIG. 4 (circle indicated as an own line n), the light wavelength can be correctly estimated by monitoring the transmittance of light output from the etalon filter.

However, in the above-mentioned wavelength monitor disclosed in JP 2004-132704 A or JP 2003-324241 A, there is a problem in that the light wavelength is erroneously estimated when the light wavelength drifts significantly from the target wavelength due to a deterioration or a failure or the like of the optical transmitter. For example, as illustrated in FIG. 4, when the light wavelength of the own line n is drifted to the neighborhood of an adjoining wavelength grid (target wavelength of adjoining line n±1), the transmittance of the light passing through the etalon filter has a value approximately equal to a value of the transmittance when the light wavelength is in the neighborhood of the target wavelength, and hence the wavelength monitor erroneously recognizes that the light wavelength is in the neighborhood of the target wavelength. Consequently, with the above-mentioned wavelength monitor, there occurs a case in which when the light wavelength drifts significantly, the wavelength drift is erroneously detected and communication failure cannot be correctly detected.

SUMMARY OF THE INVENTION

An object of the present invention is to provide an optical transmission module, a wavelength monitor, and a wavelength drift detection method capable of detecting a wavelength drift of laser light with no error.

In order to solve the above-mentioned problem, an optical transmission module according to the present invention includes: a laser source; monotonous variation amount detection means for detecting a physical amount that monotonously increases or monotonously decreases with respect to a wavelength of laser light output from the laser source; periodical variation amount detection means for detecting a physical amount that periodically varies with respect to the wavelength of the laser light; and wavelength drift detection means for detecting a wavelength drift of the laser light from a target wavelength based on the physical amount detected by the monotonous variation amount detection means and the physical amount detected by the periodical variation amount detection means.

According to the present invention, the wavelength drift of the laser light is detected based not only on the physical amount that periodically varies with respect to the wavelength of the laser light but also on the physical amount that monotonously increases or monotonously decreases with respect to the wavelength of the laser light. Consequently, even when the wavelength of the laser light drifts significantly from a target wavelength due to a deterioration or a failure or the like of the laser source, the wavelength drift of the laser light can be detected with no error.

Further, in one aspect of the present invention, when the physical amount detected by the monotonous variation amount detection means is within a predetermined range corresponding to the target wavelength, the wavelength drift detection means detects the wavelength drift based on the physical amount detected by the periodical variation amount detection means, and when the physical amount detected by the monotonous variation amount detection means is outside the predetermined range, the wavelength drift detection means detects the wavelength drift based on the physical amount detected by the monotonous variation amount detection means.

According to this aspect, even when the wavelength of the laser light drifts out of a predetermined range corresponding to the target wavelength due to a deterioration or a failure or the like of the laser source, the wavelength drift of the laser light can be detected with no error.

Further, in one aspect of the present invention, the monotonous variation amount detection means detects a temperature of the laser source.

According to this aspect, the wavelength drift of the laser light can be detected based on a relation between the temperature of the laser source and the wavelength of the laser light.

Further, in one aspect of the present invention, the optical transmission module further includes a first temperature detection means for detecting a temperature in a neighborhood of the laser source, in which the monotonous variation amount detection means detects the temperature of the laser source based on the temperature detected by the first temperature detection means.

In this aspect, the optical transmission module may further include a second temperature detection means for detecting a temperature in a position farther away from the laser source than the first temperature detection means, in which the monotonous variation amount detection means may detect the temperature of the laser source further based on a temperature gradient between the temperature detected by the first temperature detection means and the temperature detected by the second temperature detection means. This allows obtaining a more accurate temperature of the laser source, whereby the wavelength drift of the laser light can be accurately detected.

In this aspect, the optical transmission module may further include bias current detection means for detecting a bias current applied to the laser source, in which the monotonous variation amount detection means may detect the temperature of the laser source further based on the bias current detected by the bias current detection means. This allows obtaining a more accurate temperature of the laser source, whereby the wavelength drift of the laser light can be accurately detected.

Further, in one aspect of the present invention, the periodical variation amount detection means detects a transmittance of the laser light passing through an optical filter whose transmittance periodically varies with respect to a wavelength of incident light. As an example of the optical filter, an etalon filter is used.

According to this aspect, the wavelength drift of the laser light can be detected based on a relation between the wavelength of the laser light and the transmittance of the optical filter.

In this aspect, the optical transmission module may further include a third temperature detection means for detecting a temperature of the optical filter, in which the periodical variation amount detection means may correct the detected transmittance based on the temperature detected by the third temperature detection means. This allows obtaining a more accurate transmittance with consideration given to the temperature dependence of the optical filter, whereby the wavelength drift of the laser light can be accurately detected.

Further, in one aspect of the present invention, the optical transmission module further includes light intensity detection means for detecting a light intensity of the laser light, in which the wavelength drift detection means detects the wavelength drift based on whether the light intensity detected by the light intensity detection means is less than a predetermined power or not.

According to this aspect, the wavelength drift can be more flexibly detected, for example, with consideration given to the operating state of the laser source (whether the laser source emits light normally or not, etc.).

Further, in one aspect of the present invention, the optical transmission module further includes alarm determination means for determining whether to output an alarm or not according to a result of a wavelength drift detection by the wavelength drift detection means.

According to this aspect, an alarm can be issued according to the magnitude of the detected wavelength drift or the like.

Further, a wavelength monitor according to the present invention includes: monotonous variation amount detection means for detecting a physical amount that monotonously increases or monotonously decreases with respect to a wavelength of laser light output from a laser source; periodical variation amount detection means for detecting a physical amount that periodically varies with respect to the wavelength of the laser light; and wavelength drift detection means for detecting a wavelength drift of the laser light from a target wavelength based on the physical amount detected by the monotonous variation amount detection means and the physical amount detected by the periodical variation amount detection means.

Further, a wavelength drift detection method according to the present invention includes: a monotonous variation amount detection step of detecting a physical amount that monotonously increases or monotonously decreases with respect to a wavelength of laser light output from a laser source; a periodical variation amount detection step of detecting a physical amount that periodically varies with respect to the wavelength of the laser light; and a step of detecting a wavelength drift of the laser light from a target wavelength based on the physical amount detected in the monotonous variation amount detection step and the physical amount detected in the periodical variation amount detection step.

According to the present invention, even when the wavelength of the laser light drifts significantly from the target wavelength due to a deterioration or a failure or the like of the laser source, the wavelength drift of the laser light can be detected with no error. Moreover, a wavelength monitor and a wavelength alarm can be easily structured without addition of any optical component to the conventional optical transmission module.

DETAILED DESCRIPTION OF THE INVENTION

Hereinafter, embodiments of the present invention are described in detail with reference to the drawings.

[First Embodiment]

Figure 1:
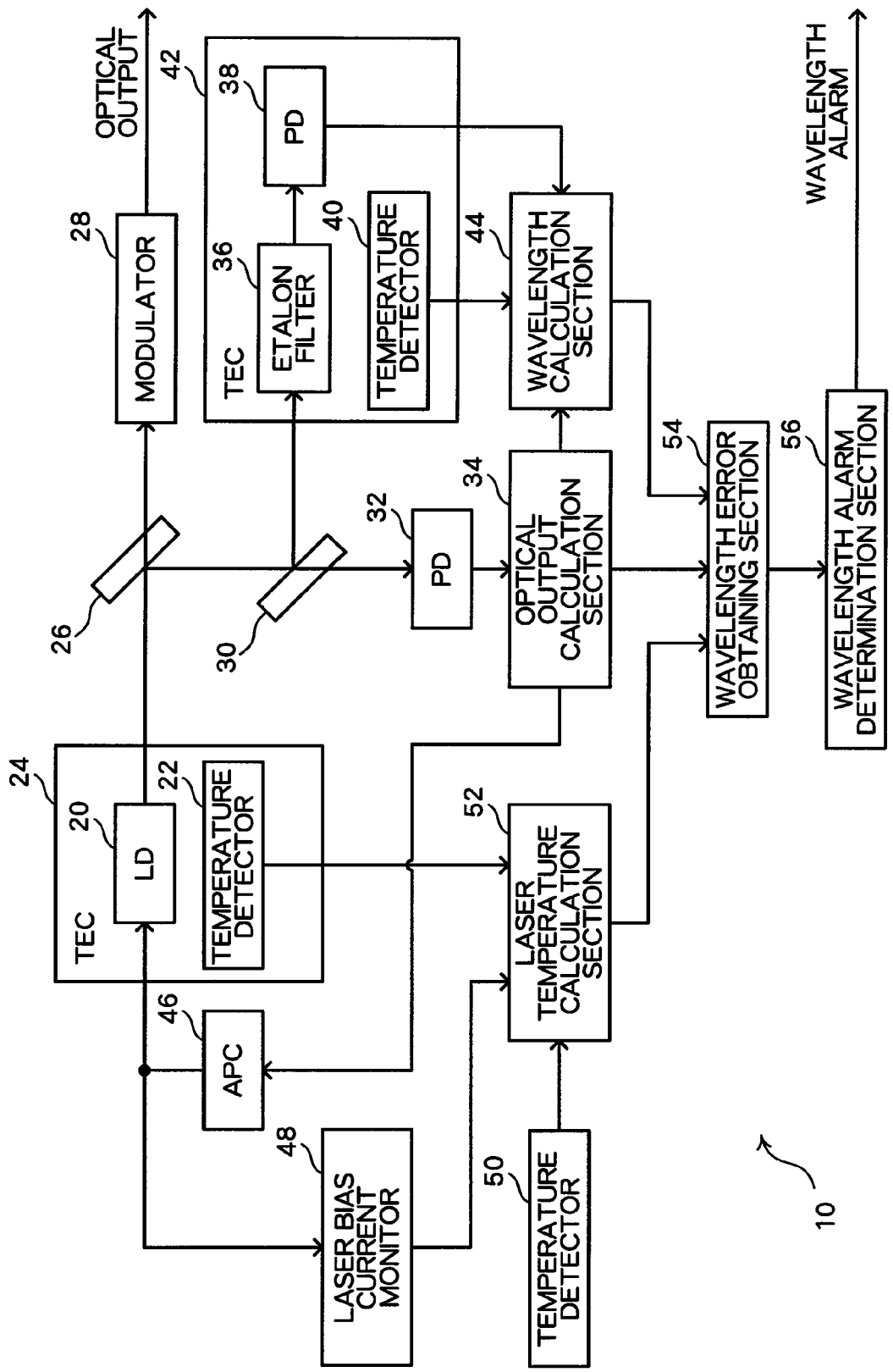
FIG. 1 is a functional block diagram of an optical transmission module according to a first embodiment of the present invention.

FIG. 1 is a functional block diagram of an optical transmission module 10 according to a first embodiment of the present invention. As illustrated in FIG. 1, the optical transmission module 10 includes a laser diode (LD) 20, temperature detectors 22, 40, and 50, Peltier devices (thermoelectric coolers: TECs) 24 and 42, optical splitters 26 and 30, a modulator 28, photodiodes (PDs) 32 and 38, an optical output calculation section 34, an etalon filter 36, a wavelength calculation section 44, an auto power controller (APC) 46, a laser bias current monitor 48, a laser temperature calculation section 52, a wavelength error obtaining section 54, and a wavelength alarm determination section 56. Of these, the optical output calculation section 34, the wavelength calculation section 44, the laser temperature calculation section 52, the wavelength error obtaining section 54, and the wavelength alarm determination section 56 are each constituted by, for example, a microcontroller and a program that controls the operation of the microcontroller.

The laser diode 20 is a light emitting device that outputs laser light of an intensity corresponding to the applied bias current.

The wavelength of the laser light output from the laser diode 20 varies according to the temperature of the laser diode 20. For this reason, the optical transmission module 10 controls the temperature of the laser diode 20 so that the wavelength of the laser light output from the laser diode 20 is maintained at a predetermined target wavelength (target wavelength).

Figure 3:
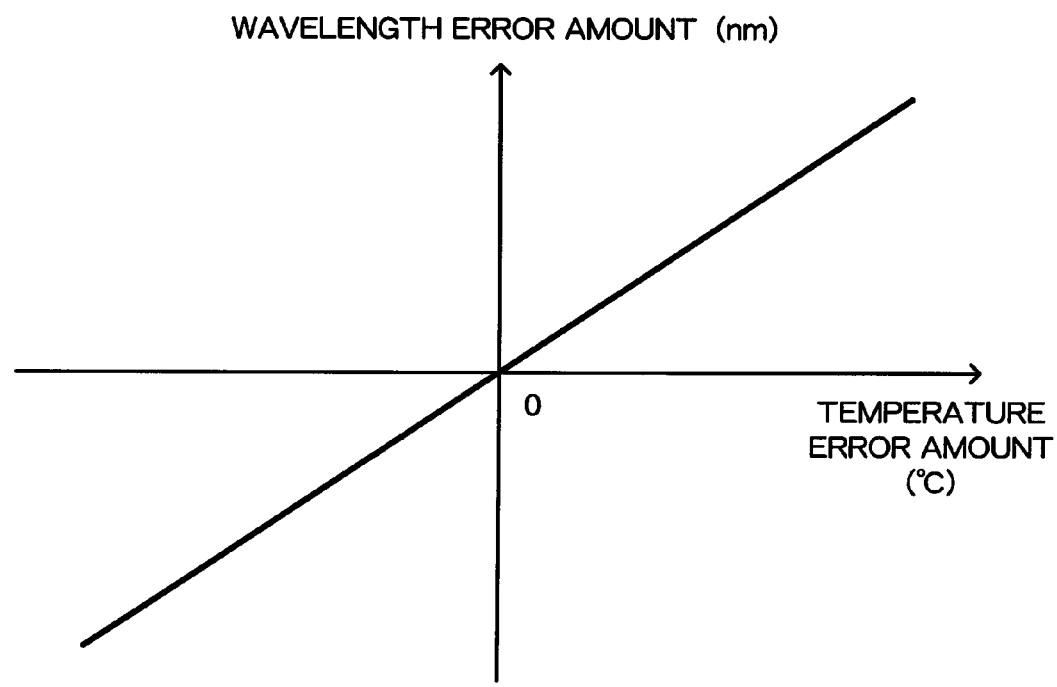
FIG. 3 is a graph illustrating a relation between the temperature error amount of a laser diode and the wavelength error amount of laser light.

FIG. 3 is a graph illustrating a relation between the temperature error amount of the laser diode 20 and the wavelength error amount of the laser light output from the laser diode 20. As illustrated in FIG. 3, the wavelength error amount of the laser light monotonously increases as the temperature error amount of the laser diode 20 increases (the temperature of the laser diode 20 monotonously increases or monotonously decreases as the wavelength of the laser light increases). The temperature (target temperature) of the laser diode 20 necessary for maintaining the wavelength of the laser light at the target wavelength is derived from this relation. Moreover, by detecting the temperature of the laser diode 20, the wavelength of the laser light output from the laser diode 20 can be estimated.

The temperature of the laser diode 20 is monitored by the temperature detector 22 disposed in the neighborhood of the laser diode 20. The temperature detector 22 outputs the detected temperature in the neighborhood of the laser diode 20, to the laser temperature calculation section 52.

The laser diode 20 and the temperature detector 22 are mounted on the Peltier device 24 which is one of thermoelectric coolers. The Peltier device 24 controls the temperature of the laser diode 20 so that the temperature detected by the temperature detector 22 is the target temperature derived from the relation illustrated in FIG. 3.

The laser light output from the laser diode 20 is split into two directions by the optical splitter 26. One of the beams of laser light split by the optical splitter 26 is incident on the modulator 28, and the other is further split into two directions by the optical splitter 30. One of the beams of laser light split by the optical splitter 30 is incident on the photodiode 32, and the other is incident on the etalon filter 36.

The modulator 28 modulates the laser light incident through the optical splitter 26, into a transmission signal, and sends out the modulated laser light to the outside of the optical transmission module 10.

The photodiode 32 is a light receiving device that converts the laser light incident through the optical splitter 30, into an electric signal. The photodiode 32 outputs a current corresponding to the intensity of the received laser light, to the optical output calculation section 34.

The optical output calculation section 34 calculates the intensity of the laser light output from the laser diode 20, based on the current input from the photodiode 32. Then, the optical output calculation section 34 outputs the calculated light intensity to each of the wavelength calculation section 44, the auto power controller 46, and the wavelength error obtaining section 54.

Figure 4:
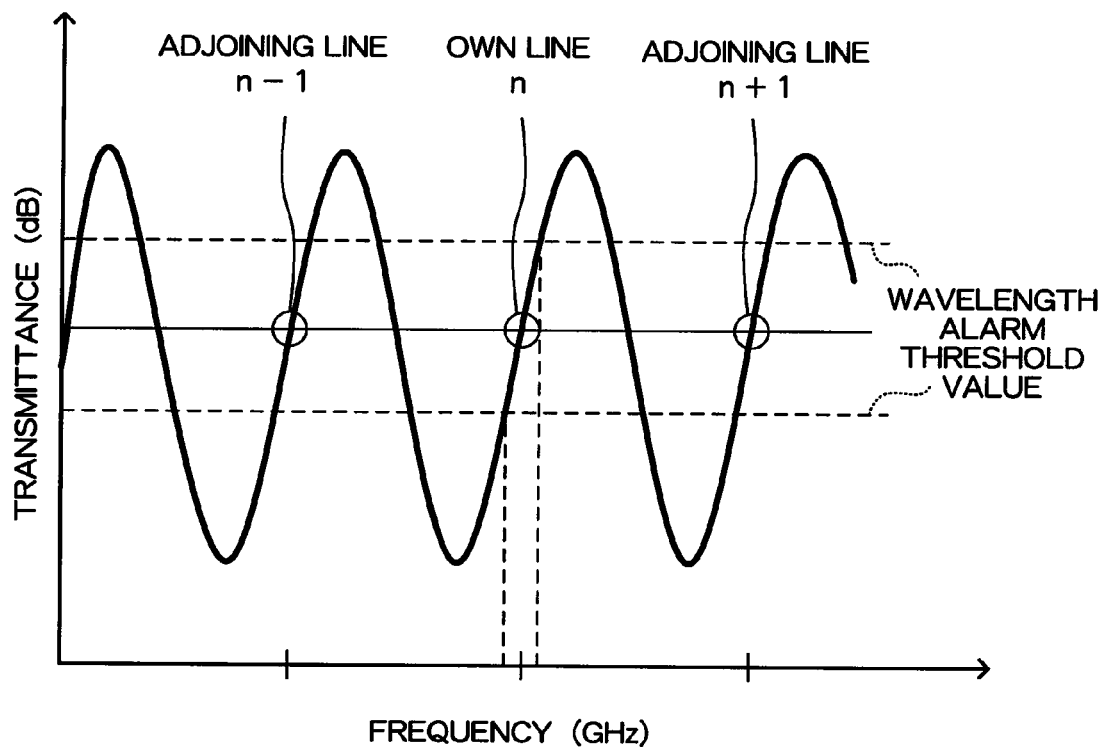
FIG. 4 is a graph illustrating a characteristic of an etalon filter.

The etalon filter 36 is one of optical filters whose transmittance periodically varies with respect to the wavelength of the incident light, and has a characteristic as illustrated in FIG. 4. For this reason, by detecting the transmittance of the laser light incident on the etalon filter 36 through the optical splitter 30, the wavelength of the laser light output from the laser diode 20 can be estimated. In this embodiment, it is assumed that the accuracy of the estimation of the laser wavelength by this method is higher than that of the estimation of the laser wavelength based on the temperature of the laser diode 20.

The photodiode 38 outputs a current corresponding to the intensity of the laser light passing through the etalon filter 36, to the wavelength calculation section 44.

The temperature detector 40 monitors the temperature in the neighborhood of the etalon filter 36, and outputs the detected temperature to the wavelength calculation section 44.

The etalon filter 36, the photodiode 38, and the temperature detector 40 are mounted on the Peltier device 42, and cooled by the Peltier device 42 as appropriate.

The wavelength calculation section 44 calculates the intensity of the laser light passing through the etalon filter 36, based on the current input from the photodiode 38, and divides the calculated light intensity (light intensity after passing through etalon filter 36) by the light intensity input from the optical output calculation section 34 (light intensity before passing through etalon filter 36) to thereby calculate the transmittance of the laser light passing through the etalon filter 36. Further, the wavelength calculation section 44 estimates the wavelength of the laser light output from the laser diode 20 (converts transmittance into wavelength) based on the calculated transmittance and the characteristic of the etalon filter 36 (see FIG. 4), and outputs the estimated laser wavelength to the wavelength error obtaining section 54.

When the characteristic of the etalon filter 36 has a temperature dependence, the wavelength calculation section 44 may correct the characteristic of the etalon filter 36 based on the temperature in the neighborhood of the etalon filter 36 detected by the temperature detector 40. By doing this, the accuracy of the estimation of the laser wavelength calculated by the wavelength calculation section 44 is improved. Moreover, when the light intensity input from the optical output calculation section 34 is less than a predetermined power (for example, a value extremely close to zero), the wavelength calculation section 44 may output a preset fixed value to the wavelength error obtaining section 54 as the laser wavelength.

The auto power controller 46 controls the bias current applied to the laser diode 20 based on the intensity of the laser light calculated by the optical output calculation section 34 so that the intensity of the laser light output from the laser diode 20 is constant.

The laser bias current monitor 48 monitors the bias current applied to the laser diode 20, and outputs the detected bias current value to the laser temperature calculation section 52.

The temperature detector 50 is disposed in a position farther away from the laser diode 20 than the temperature detector 22 that monitors the temperature in the neighborhood of the laser diode 20. The temperature detector 50 monitors the temperature at the position, and outputs the detected temperature to the laser temperature calculation section 52.

The laser temperature calculation section 52 calculates the temperature of the laser diode 20 based on the temperature in the neighborhood of the laser diode 20 detected by the temperature detector 22. Then, the laser temperature calculation section 52 outputs the calculated temperature of the laser diode 20 to the wavelength error obtaining section 54.

The laser temperature calculation section 52 may calculate the temperature of the laser diode 20 (correct the temperature detected by the temperature detector 22) based on the temperature gradient between the temperature detected by the temperature detector 22 and the temperature detected by the temperature detector 50 disposed in the position farther away from the laser diode 20 than the temperature detector 22. By doing this, the temperature of the laser diode 20 can be more accurately detected.

Moreover, the laser temperature calculation section 52 may estimate the heating value of the laser diode 20 based on the bias current to the laser diode 20 output from the laser bias current monitor 48 and calculate the temperature of the laser diode 20 (correct temperature detected by temperature detector 22) based on the estimated heating value. For example, when the light intensity per bias current is decreased due to a deterioration of the laser diode 20, it is necessary to increase the bias current applied to the laser diode 20. In this case, it sometimes occurs that the wavelength of the laser light output from the laser diode 20 makes no change though the temperature of the laser diode 20 increases. That is, there are cases where a deterioration of the laser diode 20 causes an error in the relation between the temperature of the laser diode 20 and the laser wavelength (see FIG. 3). In such cases, by subtracting the heating value of the laser diode 20 corresponding to the bias current increase amount from the temperature detected by the temperature detector 22, the error caused in the relation between the temperature of the laser diode 20 and the laser wavelength can be corrected.

The wavelength error obtaining section 54 detects the wavelength drift, from the target wavelength, of the laser light output from the laser diode 20, based on the laser wavelength input from the wavelength calculation section 44 and the temperature of the laser diode 20 input from the laser temperature calculation section 52 (obtains wavelength error between laser wavelength and target wavelength).

That is, when the temperature of the laser diode 20 calculated by the laser temperature calculation section 52 is within a predetermined temperature range including the target temperature (temperature of laser diode 20 necessary for maintaining wavelength of laser light at target wavelength), the wavelength error obtaining section 54 obtains the error between the laser wavelength estimated by the wavelength calculation section 44 and the target wavelength, as the wavelength error. It is desirable that the predetermined temperature range including the target temperature be wider than the temperature range corresponding to the wavelength alarm threshold value illustrated in FIG. 4 and narrower than the temperature range corresponding to half the transmittance variation cycle illustrated in FIG. 4. On the other hand, when the temperature of the laser diode 20 calculated by the laser temperature calculation section 52 is outside the predetermined temperature range, the wavelength error obtaining section 54 estimates the laser wavelength (converts temperature into wavelength) based on the relation between the temperature of the laser diode 20 and the laser wavelength (see FIG. 3) and the temperature of the laser diode 20 calculated by the laser temperature calculation section 52, and obtains the error between the estimated laser wavelength and the target wavelength as the wavelength error. Then, the wavelength error obtaining section 54 outputs the thus obtained wavelength error to the wavelength alarm determination section 56.

When the light intensity input from the optical output calculation section 34 is less than the predetermined power, the wavelength error obtaining section 54 may output a predetermined wavelength error to the wavelength alarm determination section 56 irrespective of the laser wavelength input from the wavelength calculation section 44 and the temperature of the laser diode 20 input from the laser temperature calculation section 52.

When the wavelength error input from the wavelength error obtaining section 54 is equal to or more than the preset wavelength alarm threshold value (see FIG. 4), the wavelength alarm determination section 56 generates an alarm indicative of laser wavelength abnormality, and outputs the generated alarm to the outside.

[Second Embodiment]

Figure 2:
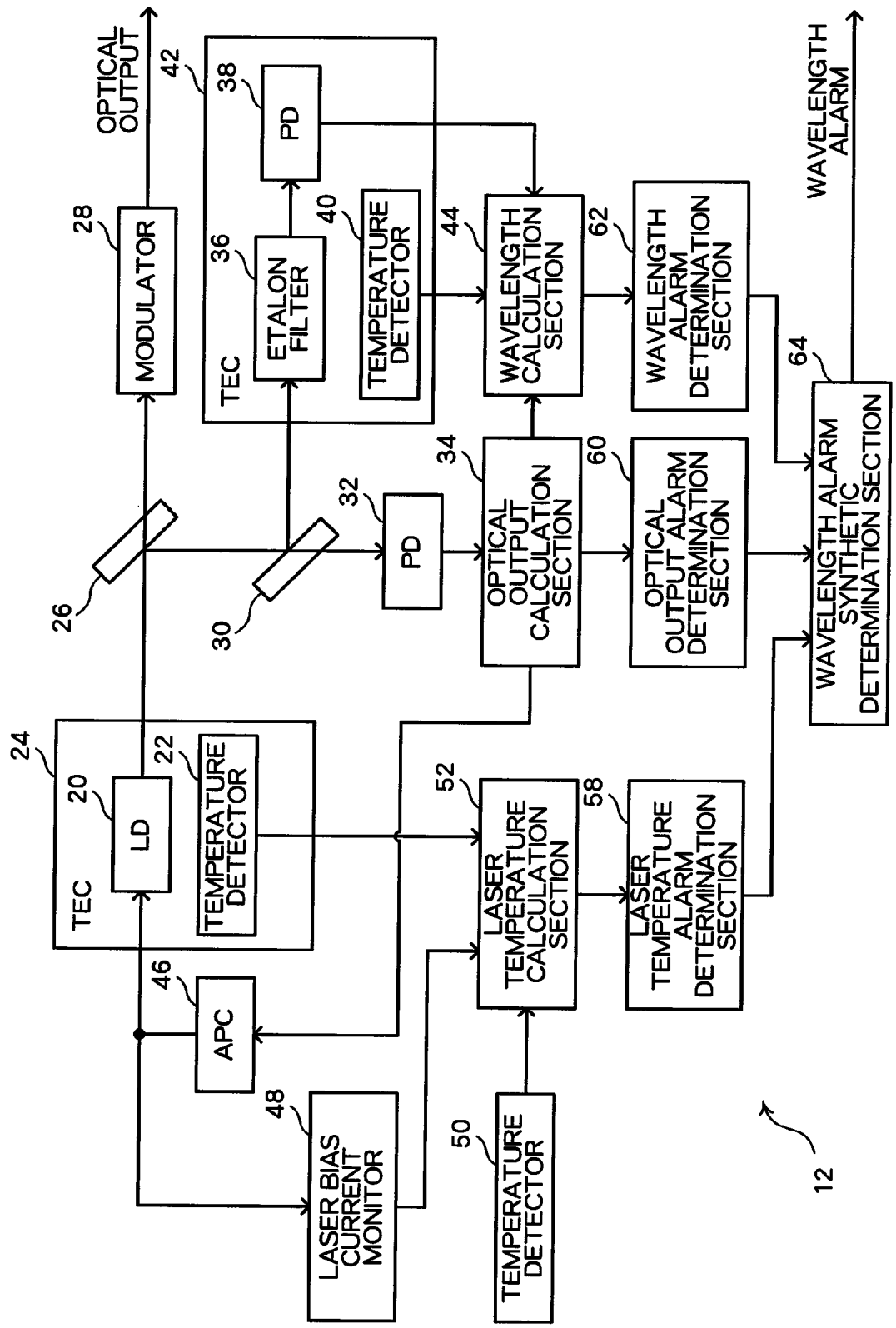
FIG. 2 is a functional block diagram of an optical transmission module according to a second embodiment of the present invention.

FIG. 2 is a functional block diagram of an optical transmission module 12 according to a second embodiment of the present invention. As illustrated in FIG. 2, the optical transmission module 12 includes a laser diode 20, temperature detectors 22, 40, and 50, Peltier devices 24 and 42, optical splitters 26 and 30, a modulator 28, photodiodes 32 and 38, an optical output calculation section 34, an etalon filter 36, a wavelength calculation section 44, an auto power controller 46, a laser bias current monitor 48, a laser temperature calculation section 52, a laser temperature alarm determination section 58, an optical output alarm determination section 60, a wavelength alarm determination section 62, and a wavelength alarm synthetic determination section 64. Of these, the optical output calculation section 34, the wavelength calculation section 44, the laser temperature calculation section 52, the optical output alarm determination section 60, the wavelength alarm determination section 62, and the wavelength alarm synthetic determination section 64 are each constituted by, for example, a microcontroller and a program for controlling the operation of the microcontroller.

In the following, to avoid duplicating description, a structure different from that of the optical transmission module 10 will be mainly described.

The laser temperature alarm determination section 58 determines whether or not a laser temperature alarm is necessary according to whether or not the temperature of the laser diode 20 calculated by the laser temperature calculation section 52 is within the predetermined temperature range including the target temperature.

The optical output alarm determination section 60 determines whether or not an optical output alarm is necessary according to whether or not the light intensity calculated by the optical output calculation section 34 is less than a predetermined optical output alarm threshold value.

The wavelength alarm determination section 62 determines whether or not a wavelength alarm is necessary according to whether or not the laser wavelength estimated by the wavelength calculation section 44 is within a predetermined wavelength range corresponding to the wavelength alarm threshold value (see FIG. 4).

The wavelength alarm synthetic determination section 64 finally determines whether or not an alarm output is necessary based on the three determination results of the determination result by the laser temperature alarm determination section 58, the determination result by the optical output alarm determination section 60, and the determination result by the wavelength alarm determination section 62.

When finally determining whether or not an alarm output is necessary, the wavelength alarm synthetic determination section 64 may use the three determination results in any combination. For example, the optical output alarm determination section 60 may outputs an alarm indicative of laser wavelength abnormality when at least one of the three determination results is "necessary", and may cancel an alarm output when all of the three determination results are "unnecessary".

In the optical transmission modules 10 and 12 described above, the wavelength drift (wavelength error) of the laser light is detected based not only on the physical amount that periodically varies with respect to the wavelength of the laser light (transmittance of laser light incident on etalon filter 36) but also on the physical amount that monotonously increases with respect to the wavelength of the laser light (temperature of laser diode 20). Consequently, even when the wavelength of the laser light drifts significantly from the target wavelength due to a deterioration or failure or the like of the laser diode 20, the wavelength drift of the laser light can be detected with no error.

The present invention is not limited to the above-mentioned embodiments, but is widely applicable to all kinds of optical transmission modules and all kinds of wavelength monitors.

While in the above-mentioned embodiments, the temperature of the laser diode is illustrated as an example of the physical amount that monotonously increases or monotonously decreases with respect to the wavelength of the laser light output from the laser source, the intensity of the laser light passing through the optical filter whose transmittance linearly varies with respect to the wavelength of the incident light may be used.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmission module, comprising:
a laser source;
a laser source temperature detector for detecting a temperature of the laser source, wherein the temperature of the laser source monotonously increases or monotonously decreases with respect to a wavelength of a laser light output from the laser source;
a wavelength calculation section for detecting a transmittance of the laser light through an optical filter, wherein the transmittance of the laser light periodically varies with respect to the wavelength of the laser light;
an optical output calculation section for detecting an intensity of the laser light output from the laser source, wherein the intensity of the laser output monotonously increases or monotonously decreases with respect to a light intensity of the laser light; and
a wavelength drift detector for detecting a wavelength drift of the laser light from a target wavelength based on the temperature detected by the laser source temperature detector, the transmittance detected by the wavelength calculation section, and the intensity detected by the optical output calculation section.

2. An optical transmission module according to claim 1, wherein:
when the temperature of the laser source detected by the temperature detector is within a predetermined range corresponding to the target wavelength, the wavelength drift detector detects the wavelength drift based on the transmittance of the laser light of the optical filter detected by the the wavelength calculation section, and
when the temperature of the laser source detected by the temperature detector is outside the predetermined range, the wavelength drift detector detects the wavelength drift based on the temperature of the laser source detected by the temperature detector.

3. An optical transmission module according to claim 1, further comprising:
a first temperature detector for detecting a first temperature in a neighborhood of the laser source,
wherein the laser source temperature detector detects the temperature of the laser source based on the first temperature detected by the first temperature detector.

4. An optical transmission module according to claim 3, further comprising:
a second temperature detector for detecting a second temperature in a position farther away from the laser source than the first temperature detector,
wherein the laser source temperature detector detects the temperature of the laser source further based on a temperature gradient between the first temperature and the second temperature.

5. An optical transmission module according to claim 3, further comprising:
a laser bias current monitor for detecting a bias current applied to the laser source,
wherein the laser source temperature detector detects the temperature of the laser source further based on a bias current detected by the laser bias current monitor.

6. An optical transmission module according to claim 1, further comprising:
a third temperature detector for detecting a third temperature of the optical filter,
wherein the wavelength calculation section corrects the detected transmittance based on the third temperature detected by the third temperature detector.

7. An optical transmission module according to claim 1, wherein the optical filter is an etalon filter.

8. An optical transmission module according to claim 1, wherein the wavelength drift detector detects the wavelength drift based on whether the intensity of the laser light detected by the optical output calculation section is less than a predetermined power or not.

9. An optical transmission module according to claim 1, further comprising alarm determination section for determining whether to output an alarm or not according to a result of the wavelength drift detection by the wavelength drift detector.

10. A wavelength monitor, comprising:
a laser source temperature detector for detecting a temperature of a laser source, wherein the temperature of the laser source monotonously increases or monotonously decreases with respect to a wavelength of a laser light output from the laser source;
a wavelength calculation section for detecting a transmittance of the laser light through an optical filter, wherein the transmittance of the laser light periodically varies with respect to the wavelength of the laser light;
an optical output calculation section for detecting an intensity of the laser light output from the laser source, wherein the intensity of the laser light monotonously increases or monotonously decreases with respect to a light intensity of the laser light; and
a wavelength drift detector for detecting a wavelength drift of the laser light from a target wavelength based on the temperature detected by the temperature detector, the transmittance detected by the wavelength calculation section, and the intensity detected by the optical output calculation section.

11. A wavelength drift detection method, comprising:
a laser source temperature detection step of detecting a temperature of a laser source, wherein the temperature of the laser source monotonously increases or monotonously decreases with respect to a wavelength of a laser light output from the laser source;
a wavelength calculation step of detecting a transmittance of the laser light through an optical filter, wherein the transmittance of the laser light periodically varies with respect to the wavelength of the laser light;
an optical output calculation step of detecting an intensity of the laser light output from the laser source, wherein the intensity of the laser light monotonously increases or monotonously decreases with respect to a light intensity of the laser light; and
a step of detecting a wavelength drift of the laser light from a target wavelength based on the detected temperature of the laser source, the detected transmittance of the laser light through the optical filter, and the detected intensity of the laser light.

* * * * *